United States Patent [19]

Schulz et al.

[11] Patent Number: 5,310,607
[45] Date of Patent: May 10, 1994

[54] HARD COATING; A WORKPIECE COATED BY SUCH HARD COATING AND A METHOD OF COATING SUCH WORKPIECE BY SUCH HARD COATING

[75] Inventors: Hans Schulz, Fürstentum Liechtenstein, Fed. Rep. of Germany; Erich Bergmann, Mels, Switzerland

[73] Assignee: Balzers Aktiengesellschaft, Balzers, Liechtenstein

[21] Appl. No.: 744,532

[22] Filed: Aug. 13, 1991

[30] Foreign Application Priority Data

May 16, 1991 [CH] Switzerland .............. 1470/91

[51] Int. Cl.$^5$ .................. C23C 16/40; B23B 27/14
[52] U.S. Cl. .................. 428/697; 106/286.2; 106/286.5; 428/701; 428/702
[58] Field of Search .................. 428/697, 701, 702; 106/286.2, 286.5

[56] References Cited

U.S. PATENT DOCUMENTS

| | | | |
|---|---|---|---|
| Re. 31,526 | 2/1984 | Smith et al. ............ | 428/469 |
| 3,511,703 | 5/1970 | Peterson . | |
| 3,837,894 | 9/1974 | Tucker, Jr. ............ | 148/31.5 |
| 3,990,860 | 11/1976 | Fletcher et al. ............ | 428/404 |
| 4,112,148 | 9/1978 | Fonzi ............ | 427/255 |
| 4,357,382 | 11/1982 | Lambert et al. ............ | 428/216 |
| 4,495,907 | 1/1985 | Kamo ............ | 428/472 |
| 4,540,596 | 9/1985 | Nimmagadda ............ | 427/37 |
| 4,615,913 | 10/1986 | Jones et al. ............ | 427/226 |
| 4,668,585 | 5/1987 | Tsuji et al. ............ | 428/467 |
| 4,822,689 | 4/1989 | Fukubayashi et al. ............ | 428/472 |

FOREIGN PATENT DOCUMENTS 2422728  4/1978  France .

OTHER PUBLICATIONS

Yoshizaki et al "Electrical Properties of Evaporated Thin Films of Cr-Al-B alloy" J. Japan Inst Metals vol. 53, No. 11, 1989 pp. 1177–1183.
Swiss Patent Office Search Report for Priority Application 1470/91 filed May 16, 1992.
Lux, et al., "Preparation of Alumina Coatings by Chemical Vapour Deposition", Thin Solid Films, 138 (1986) Apr., No. 1, Lausanne, Switzerland.

Primary Examiner—A. A. Turner
Attorney, Agent, or Firm—Notaro & Michalos

[57] ABSTRACT

The hard coating includes mainly $(Al,Cr)_2O_3$ crystals and a chrome content higher than 5 at % wherein the $(Al, Cr)_2O_3$ is a single crystal. The coating is deposited at a temperature lower than 90° C., preferably lower than 500° C. The hard coating is deposited by a CVD or PVD process.

8 Claims, 3 Drawing Sheets

HARD COATING; A WORKPIECE COATED BY SUCH HARD COATING AND A METHOD OF COATING SUCH WORKPIECE BY SUCH HARD COATING

BACKGROUND OF THE INVENTION

1. Field of the Invention

The present invention relates to a hard coating. It relates further to a workpiece coated by such hard coating and to a method of coating a workpiece by such a hard coating.

2. Description of the Prior Art

A predominant feature of aluminum oxide is an extremely high thermodynamic stability and a comparatively high hardness. As thermodynamic stability thereof is understood its resistance in an aggressive environment also at high temperatures. Apart from its use on parts subject to wear in aggressive mediums aluminum oxide is used as coating material, especially for tools used for machining or cutting operations. Coatings of aluminum oxide are further used in optical and electronic applications. Generally known is the deposition of aluminum oxide coatings by means of chemical or physical gas phase deposition, CVD or PVD. In case of a chemical deposition aluminum chloride is brought to react with water vapor. At reaction temperatures of 1000° C. coatings grow at a rate of maximal 0.3 μm/h such as disclosed in the paper "Aluminium-oxid-CVD mit einem AlCl$_3$/O$_2$ Reaktionsgemisch" (Aluminum oxide CVD by a AlCl$_3$/O$_2$ reaction mixture) of H. Altena et al., R & HM, March 1987. The method described in this paper is used for a coating of hard metals. The coatings grow with crystalline structure whereby generally the α- or κ-modification of aluminum oxide is produced, see also S. Vuorinen et al., "Characterization of α-Al$_2$O$_3$, κ-Al$_2$O$_3$ and α-κ multi-oxide coatings on cemented carbides", Thin Solid Films, 193/194 (1990) 536–546.

Because the α-modification has the higher thermal stability it also has a better wear resistance. Further, because the forming of nuclei on the substrate proceeds quite inhomogeneously it is necessary, in order to achieve a coherent coating, to deposit initially an intermediate layer such as is taught in M. Kornmann et al., "Nucleation of Alumina Layers on TiC and Cemented Carbides by Chemical Vapor Deposition", J. Cryst. Growth, 28 (1975), 259–262. In technical processes generally a TiC intermediate layer is used.

If a metal organic composition is used as a Al-donor instead of an aluminum chloride, such as aluminum-triisopropylate or aluminum-trimethyl, the depositing temperature can be lowered to about 420° C. as disclosed in J. E. Carnes et al., "Self-Healing Breakdown Measurements of Pyrolytic Aluminum Oxide Films on Silicon", Journal of Applied Physics, 42 (11), 4350–4356 (1971). This method finds application e.g. in the production of electronic circuits. An amorphous, i.e. not crystalline aluminum oxide layer is produced.

For the physical deposition of aluminum oxide, vapor deposition and sputtering methods can be used. Coatings which are produced by these methods find optical and electronic applications.

In case of sputtered coatings an amorphous structure is produced at a temperature of the workpiece below 500° C. Only above a workpiece temperature of 1100° C. the α-modification segregates from aluminum oxide such as disclosed in J. A. Thornton, "Structure and Heat Treatment Characteristics of Sputter-Deposited Alumina", Am. Ceram. Soc. Bull., 56 (5), 504–508, 512 (1977).

The reactive plasma enhanced vapor deposition of aluminum oxide is described in R. F. Bunshah et al., "Alumina Deposition by Activated Reactive Evaporation", Thin Solid Films, 40, 211–216(1977). Also here crystalline coatings in a α-modification are found only at a workpiece temperature >1100° C. The mechanical properties of these coatings are, however, poor. A coating hardness of 500 to 800 HV is disclosed. Also, these coatings are described as being porous and as adhering poorly.

SUMMARY OF THE INVENTION

It is a general object of the invention to provide a hard coating on an aluminum oxide basis which at the one side is extraordinarily hard, at least as hard as aluminum oxide coatings produced by high temperature CVD, which coating can be produced at substantially lower temperatures, and for economical reasons, at a high rate of deposition, whereby rate of deposition is defined as quantity of coating material deposited per unit of time at the workpiece, to provide further a workpiece, specifically a tool for a cutting operation and having such a coating, and to provide a method of coating a workpiece with such a coating.

A further object is to provide a hard coating comprising substantially (Al,Cr)$_2$O$_3$ crystals in which the share of chrome is larger than 5 at %.

Still a further object is to provide a workpiece, specifically a tool for a cutting process which comprises a coating including a hard coating consisting substantially of (Al,Cr)$_2$O$_3$ crystals having a chrome share higher than 5 at %.

Yet a further object is to provide a method of coating a workpiece by a hard coating wherein the workpiece is coated with (Al,Cr)$_2$O$_3$ by means of a chemical (CVD) or physical (PVD) coating process, thereby maintaining a temperature below 900° C.

Surprisingly, the extremely simple measure of adding chrome to the aluminum coating material leads at coating temperatures below 1000° C., namely below 900° C., as a matter of fact below 500° C., to a hard coating which, otherwise achieved only by a high temperature CVD, is crystalline and, where otherwise only amorphous coatings can be produced, can be deposited at temperatures far below 1000° C., at 500° C. and less.

In case of generally known proceedings it is necessary to either accept high workpiece temperatures, or then only an amorphous aluminum oxide coating is produced which cannot withstand the high mechanical stress which occurs at tools and specifically tools for cutting operations.

It is namely known that coatings, especially on tools, can feature only in such a case a decisive wear resistant effect if the hardness of the coating is higher than the abrasively acting components and inclusions in the material which the tool frictionally engages, thus for instance the material to be worked. For this reason it was until now only possible to use aluminum oxide layers deposited by a high-temperature-CVD-process for an effective protection against wear.

It is, furthermore, also generally known that coating materials must feature a certain degree of crystallization in order not to fail by the generation of fissures upon mechanical peak stresses of loading. The aluminum oxide coatings which have been known until now and which have been deposited by means of a physical deposition (vaporization, sputtering) are for mentioned reasons due to their low hardness and the missing crystallization not suitable for the protection of workpieces against wear and thereby specifically not for tools for cutting or milling or like operations.

In accordance with the invention the object of having a coating temperature $\leq 500°$ C. is reached, wherewith it is also possible to provide tools made of high speed steel with such a coating without the necessity of a hardening of the tool after the application of the coating. The demand of having a low coating temperature is also true for the coating of hard metal tools because high workpiece temperatures reduce their ultimate rupture strength, which demand is now met by the present invention.

Specifically in applications at tools for performing cutting operations and having to operate intermittently, i.e. with interruptions during a working operation, i.e. at a thermal and mechanical changing load, a too low ultimate rupture strength may lead to a premature failure of the tool.

It is quite obvious that the demand regarding a high rate of coating is based on economical considerations. Although it is disclosed in J. S. Yoon et al., "Fabrication of Aluminum Oxide Films with high Deposition Rates using the Activated Reactive Evaporation Technique", Surface and Coatings Technology, 43/44 (1990), 213-222, to produce aluminum oxide by means of a vapor deposition at a rate of 6 $\mu$m/h at a static coating, it must be noted that the disclosed method also leads to an amorphous and not crystalline coating. The $\alpha$-modification of the aluminum oxide is formed only by a later annealing of the workpiece equipped with such a coating at 1200° C.

BRIEF DESCRIPTION OF THE DRAWINGS

The invention will be better understood and objects other than those set forth above, will become apparent when consideration is given to the following detailed description thereof. Such description makes reference to the annexed drawings, wherein.

DESCRIPTION OF THE PREFERRED EMBODIMENTS

The hard coating in accordance with the present invention consists substantially of $(Al,Cr)_2O_3$-crystals which are deposited by a chemical or physical deposition method. Thereby various possibilities regarding the depositing of the coating exist:

1. Starting condition

Aluminum and chrome in metallic form:

In such a case aluminum and chrome can be separately vaporized by respective electron beams in an oxygen atmosphere, or it is possible to separately vaporize aluminum and chrome by means of an arc, or it is possible to separately DC- or AC-sputter aluminum and chrome (so-called co-sputtering), also in an oxygen atmosphere.

Furthermore, it is here possible to vaporize or sputter the metallic aluminum together with the metallic chrome, such as for instance by mixing aluminum powder and chrome powder and again by means of an electron beam or an arc, again in an oxygen atmosphere.

2. Starting condition

Aluminum oxide and metallic chrome:

In this case it is possible to AC-sputter the aluminum oxide, and thereby to DC- or AC-sputter the chrome in the sense of a co-sputtering. Also here it is possible to evaporate the aluminum oxide and, separately therefrom, the metallic chrome by respective electron beams. Preferably also in this case the depositing proceeds in a reactive oxygen atmosphere.

Furthermore, $Al_2O_3$ and metallic chrome can be together vaporized by electron beam or an arc or can be sputtered.

Ion-plating can also be used for the initial conditions 1 and 2.

In all cases the coating process is controlled in such a manner that the workpiece to be coated is subjected to a temperature $\leq 900°$ C., preferably $\leq 500°$ C.

Vacuum depositing apparatuses such as AC- or DC-sputtering apparatuses, apparatuses for the electron beam evaporation, the arc evaporation or ion-plating are generally known.

Presently, the evaporating of a mixture of metallic aluminum/chrome into a reactive oxygen atmosphere out of a crucible by means of a low voltage electron beam into the crucible is preferred.

At the mentioned, preferred vaporizing by means of a low voltage electron beam onto a crucible it has been, furthermore, recognized that it is preferred to use a so-called titanium liner, i.e. to arrange a titanium intermediate layer between the wall of the copper crucible and the aluminum/chrome material charge. By means of this intermediate layer an optimal heat insulation between the charge and the copper crucible is achieved and accordingly as low as possible heat losss, and, furthermore, the co-melting of the titanium favorably influences the reactivity of the aluminum with oxygen. Due to the large difference between the vapor pressure of aluminum and that of titanium (five orders of magnitude) very unimportant amounts of titanium evaporate in the course and are found in the deposited hard coating. The use of a titanium liner can, however, be ascertained at the coating by a non-vanishing content of titanium less than 1 at %.

Figure 5:
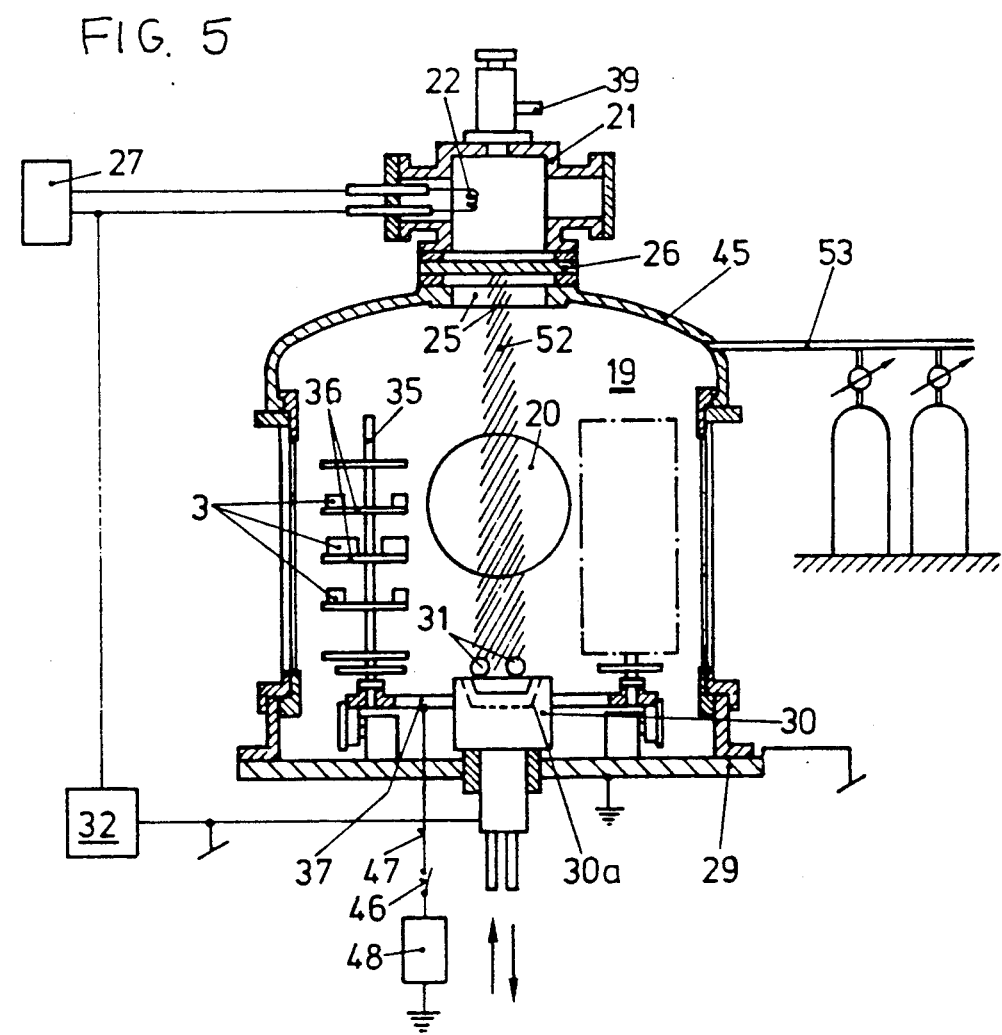
FIG. 5 illustrates schematically an exemplary apparatus for the method in accordance with the invention.

Hereinbelow examples of the production of the inventive hard coating are disclosed, produced by a preferred method of production as example, deposited on tools for a cutting operation, especially on turnover cutter plates. An apparatus used as example is illustrated in FIG. 5 and will be described in short later.

A. Coating only by aluminum oxide (as comparative method)

Aluminum was vaporized in a titanium liner in a copper crucible by means of a low voltage electron beam (plasma) maintained between crucible, liner and aluminum, resp. Hereto 50 grams of aluminum in form of pellets were firstly plaoed into the titanium liner and the titanium liner was then placed into the copper crucible. The vacuum coating- chamber was evacuated to a pressure of $2 \times 10^{-5}$ mbar and the workpieces were heated up to a temperature between 400° C. and 600° C., thereafter etched by a bombardment by argonions.

Thereafter, i.e. after the purifying etching process the low voltage electron beam was ignited at an argon pressure of $15 \times 10^{-4}$ mbar onto the crucible, the liner and the aluminum, resp.

The aluminum was melted at a beam current of 80 amps and alloyed partly with the titanium without that a substantial evaporation of aluminum occurred. After about 4 min this process was terminated and the beam current was increased to 120 amps wherewith the evaporation of the aluminum started. As already mentioned above, only insignificant amounts of titanium evaporized due to the large difference between the vapor pressures of aluminum and titanium. Within the subsequent 4 min aluminum was vaporized without any addition of reactive gas, such as to deposit an intermediate metal coating or layer, resp. onto the hard metal workpiece (hard metal: tungsten carbide and cobalt).

Thereafter the reactive gas oxygen was admitted by opening a feed valve continuously such that oxygen was admitted corresponding to a continuous rise of the partial pressure of 2 min. After the two minutes a total pressure of $20 \times 10^{-4}$ mbar was established in the vacuum chamber, the feed of oxygen amounted then to about 200 sccm/min.

The current of the beam was now controlled up to 150 amps and was kept constant during the coating time span of 60 min. Thereafter, the beam discharge and the feeding of oxygen were discontinued. After the cooling off of the workpiece the vacuum chamber was flooded and the coated workpiece was inspected: An amorphous aluminum oxide coating in terms of X-ray diffraction having a thickness of 5 μm had been formed. Apart from aluminum and oxygen at an atomic ratio of $\frac{2}{3}$ additionally 0.5 at % titanium could be proven to be in this coating. The determination of the hardness of the coating was made by a micro hardness testing instrument at a loading of 0.5N.

Thereby the Knoop-test was used such as defined in "Metallic and related coatings", British Standard Methods of test for, Part 6, Vickers and Knoop microhardness tests, of BS 5411:Part 6:1981. The maximal micro hardness was found at a hard metal test specimen coated at a temperature of the workpiece of 600° C. The value of the hardness amounts to 1130 HK (hardness value according to Knoop).

B. Production of a hard coating in accordance with the invention

In a further testing series metallic aluminum/chrome mixtures were evaporated. The object was to increase the hardness of the coating by a producing of the (Al, Cr)$_2$O$_3$ crystals in accordance with the invention. For these tests aluminum and chrome powder having a particle size of 0.5 mm were intensively mixed and fed into the above mentioned titanium liner. The parameters of the evaporation were not changed compared to the above described evaporating of aluminum.

By means of pre-testing processes the evaporation characteristics of aluminum/chrome mixtures were investigated. A substantial time related change of the rates of evaporation of aluminum and chrome could not be observed. Accordingly, a changing of the weighted samples, i.e. by the weighted relationship between aluminum and chrome, allows a variation of the composition of the coating. The mixing ratios of aluminum and chrome were varied in the range of 90:10 to 50:50 at %.

Figure 1:
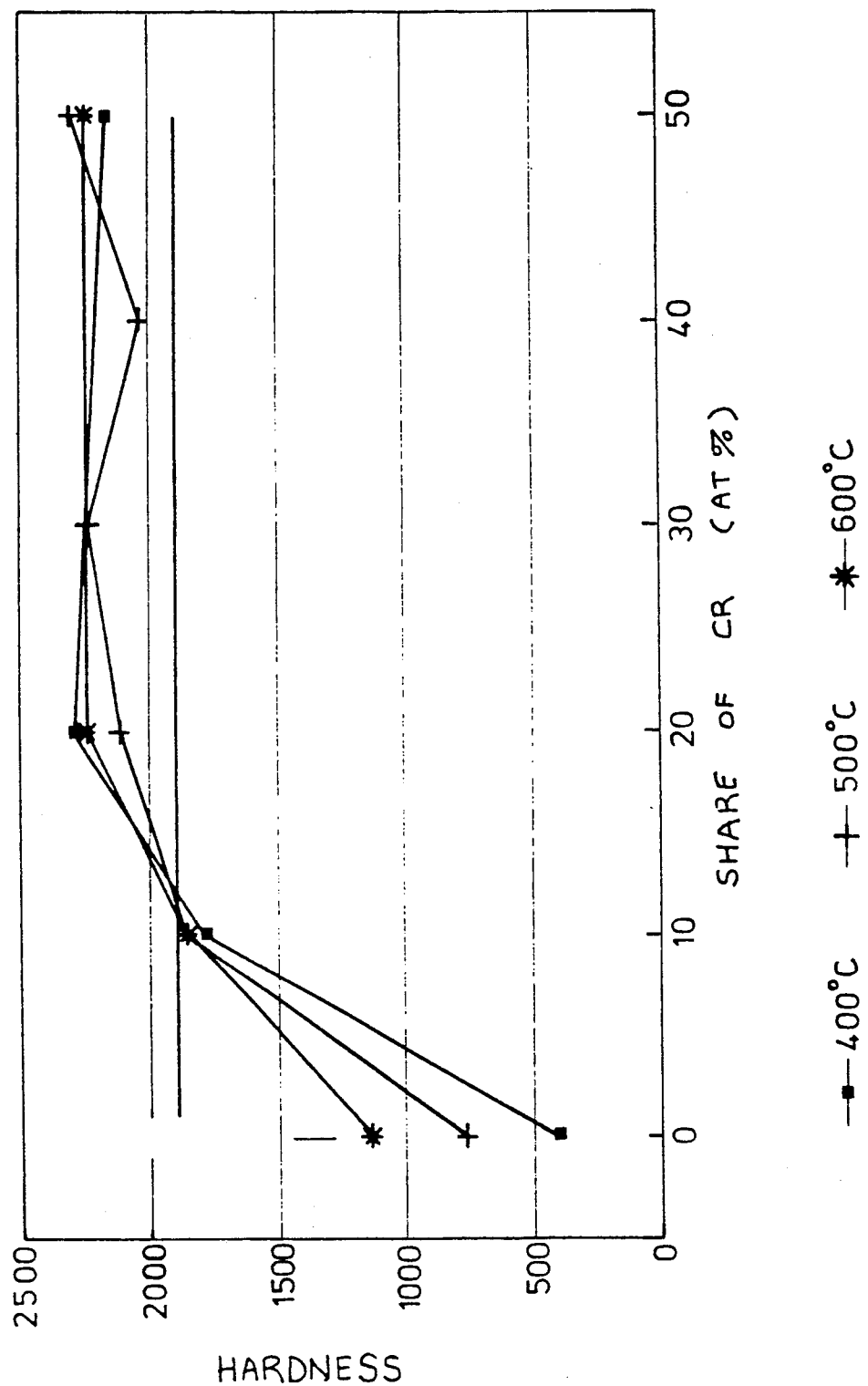
FIG. 1 illustrates the course of the Knoop-hardness of three inventive hard coatings in dependency to the share of chrome in at % in the as example vaporized melt, whereby the three coatings have been produced at different temperatures. Shown as comparison: the Knoop-hardness of sapphire.

The results of the hardness test made at the coatings produced in this way is illustrated in FIG. 1. It can be observed that already a small addition of chrome leads to a quite pronounced increase of the hardness. Above a content of chrome of about 20 at % no substantial change of the hardness was found.

In order to determine the crystallinity X-ray diffraction tests were made.

Figure 2:
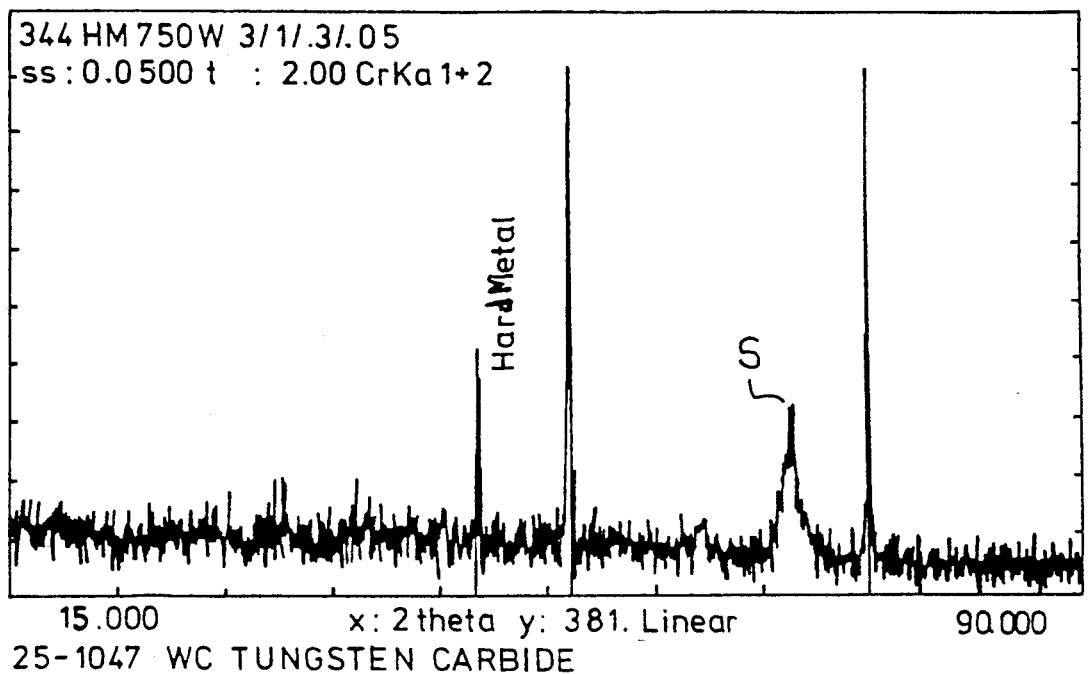
FIG. 2 illustrates an X-ray spectrum of a coating in accordance with the invention which is vapor deposited at 500° C.

FIG. 2 illustrates the X-ray spectrum of a vapor deposited material deposited at 500° C. and consisting of 90 at % aluminum and 10 at% chrome. The reflexes of the hard metal of the supporting material of the workpiece and the reflex of the coating at S can be observed. The reflex next to the coating was identified as the 202-line of the α-modification of aluminum oxide (corundum). The lattice parameter was calculated to be 2.009 Å. The position of the line shifts in correspondence to the content of chrome.

Accordingly, e.g. a lattice parameter of 2.037 Å was identified at a layer which was produced by a vapor deposition of material having the composition 50 at % aluminum, 50 at % chrome. In case of compact corundum the lattice parameter of the 202-line amounts to 1.964 Å and in case of Cr$_2$O$_3$ to 2.048 Å. Due to the compressive stress of the coatings the lattice parameter increases compared to a specimen free of stress by about 1 to 2%. For this reason the positions of the lines of the coatings are shifted in comparison to the linear interpolation between the values of Al$_2$O$_3$ and Cr$_2$O$_3$ towards Cr$_2$O$_3$.

B1. Specific apclications of the inventive coating

By means of the above described method turning inserts made of high speed steel (HSS) were coated. Turning inserts are tools of a design in which one tool e.g. of a block-like shape and square cross section has a number, e.g. 8 cutting edges (four at each end) such that after one cutting edge has worn the tool is rotated such that an adjoining cutting edge comes into operation. The coatings which were deposited were at the one side pure aluminum oxide and, at the other side, in accordance with the present invention (Al,Cr)$_2$O$_3$ coatings of a composition 90 at % Al, 10 at % Cr and further of 50 at % Al, 50 at % Cr. Onto the rake-faces of the inserts coating thicknesses of 5 μm and onto the clearance faces of the turnover plates coating thicknesses of 4 μm were deposited. The plate geometry was SCFT 120508 FN.

Bars made of unalloyed steel CK 60 were cut, i.e. machined which steel corresponds to the US Standards AISI 1064 (workpiece number 1.1221). Following cutting conditions were selected for this longitudinal lathe cutting:

| | |
|---|---|
| Cutting speed: | 100 m/min |
| Feed: | 0.2 mm/revolution |

|  |  |
|---|---|
| Depth of cut: | 2 mm |
| Cooling: | by 3% emulsion |

As the criterion eegarding the edge life or tool life, the softening of the HSS substrate material due to the increased wear was taken. The tool lives for the various coatings are listed in the following table:

| Specimen | Coating | Tool life in minutes |
|---|---|---|
| 1 | no coating | 0.5 |
| 2 | Al$_2$O$_3$ | 0.5 |
| 3 | (Al,Cr)$_2$O$_3$, 90 at % Al, 10 at % Cr | 10.5 |
| 4 | (Al,Cr)$_2$O$_3$, 50 at % Al, 50 at % Cr | 10.0 |

In this test a turning insert coated by TiN was also tested. The TiN coating was deposited by the same coating method which was used for the above mentioned inventive coatings.

The insert coated by TiN reached a tool life of 3.5 min, which is substantially worse than the mentioned inventive coatings having a tool life of 10 and 10.5 resp. min.

The unsatisfactory tool life behaviour of the coating of pure aluminum listed in the table is due to its amorphous character and thus its low hardness. This leads to the practically immediate wear of the coating due to abrasion and a breaking out of the coating.

The mechanically much more stable, harder crystalline coatings with the inventive Cr-share of more than 5%, preferably 10 to 50 at % provide in addition to the mechanical protection which is to be demanded from hard material coatings also an excellent thermal insulation against a softening of the HSS-base material. Also in this respect the TiN is clearly inferior in comparison to the inventive layer.

Figure 3:
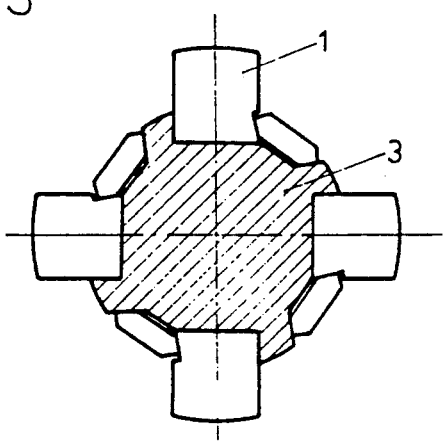
FIG. 3 a shaft having ledges representing a standard workpiece and which is to be worked by a tool structured in accordance with the invention.

For a further cutting test turning inserts of hard metal of the application class P 30. were coated. The plate geometry was in accordance with SPUN 120408. A bar 3 equipped with four ledges in accordance with FIG. 3 was cut, in accordance with the publication of J. Fabri, "Anwendungsorientierte Klassifizierung und Prüfung von unbeschichteten und beschichteten Hartmetallen beim Drehen" (Application oriented classification and testing of uncoated and coated hard metals at lathe cutting), Diss., T. H. Aachen, 1985, which serves for the simulation of the cutting relations at an interrupted cutting. As material for the ledges 1 the annealed steel 42 CrMo4 (1.7225) having a strength of 950 N/mm$^2$ was used.

The cutting conditions were
cutting speed: 125 m/min
feed: 0.2 mm/revolution
depth of cut: 2 mm
The inserts were engaged or in contact, each up to its rupture or up to an amount of 3500 hits by the ledges.

The test was made by uncoated inserts and such coated in accordance with the above described inventive method, and also cmmmercially available inserts of the same class of toughness which were equipped with a pure Al$_2$O$_3$ coating deposited by the CVD-method. At these specimens a TiC-coating of a thickness of 2 μm was additionally deposited between the aluminum oxide layer having a thickness of 3 μm and the supporting material.

The result was that only the uncoated and the inventive plates reached at all the end of the test without a breaking out of the edge. At the inserts which were coated by the CVD-method the edge broke out in an average after 2500 hits by the ledges. This is due to the change of the properties of the base material due to the high temperatures of about 1000° C. and the long coating time spans of the known CVD-coating methods.

Below, the depths of the craters (KT) and the widths of the wear-lands (VB) of the various turnover cutter plates measured after the end of the tests are listed.

Figure 4:
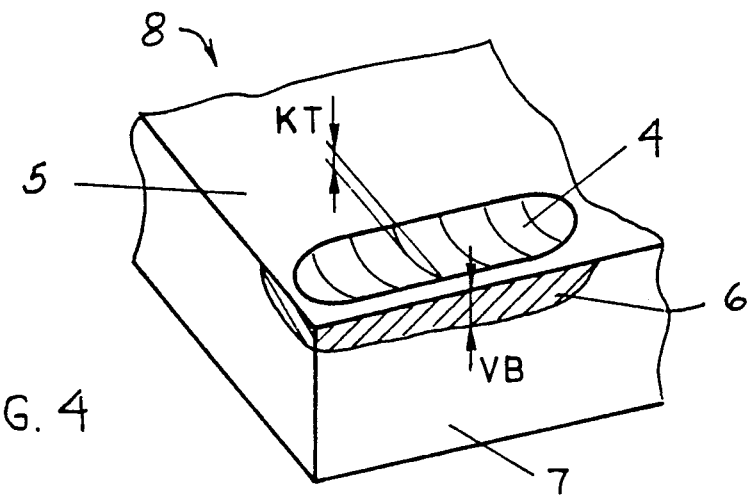
FIG. 4 illustrates schematically a turnover cutter plate including its wear marks.

In FIG. 4 the crater 4 on the rake-face 5 and the wearland 6 on the cldarance face 7 are schematically illustrated on a turnover cutter plate 8. While the depth KT of the crater is a measure for the thermodynamic stability of the coating, the width VB of the wear-land is a measure for the capacity of withstanding abrasive loadings.

| Specimen | Coating | KT(μm) | VB(μm) |
|---|---|---|---|
| 1 | uncoated | 95 | 150 |
| 2 | Al$_2$O$_3$ | 90 | 150 |
| 3 | (Al,Cr)$_2$O$_3$, 90 at % Al, 10 at % Cr | 10 | 40 |
| 4 | (Al,Cr)$_2$O$_3$, 50 at % Al, 50 at % Cr | 15 | 30 |

Also this test proves the unsufficient wear behaviour of the soft, amorphous aluminum oxide coating with broad wear-lands (VB). The result at the inventive (Al,Cr)$_2$O$_3$-coatings reflects not only the high resistance to wear of these coatings (small widths of wearland), but also the insignificant influence on the toughness properties of the base material during the coating. The different wear behaviours of the two tested inventive coatings (specimens nr. 3 and 4) are due to the different contents on chrome.

A lower content of chrome leads to a higher thermodynamic stability (lower depth of cratering) at a lower resistance to wear (larger width of the wear-land) than in case of a higher content of chrome (specimen nr. 4) which displays a lower thermodynamic stability (larger depth of cratering) but, therefore, a smaller susceptibility to abrasive wear (smaller width of wear-land).

Accordingly, it is possible to optimally coat surfaces on a tool subjected to different stresses by a respective different selective choosing of the share of chrome. Thus, a coating of a high hardness, for instance with specimen nr. 4, has a positive effect at the stressed clearance-faces of the inserts whereas the rake-face which is predominantly subjected to a chemical wear can be protected by a coating having a high thermodynamic stability, therefore by an inventive coating having a lower amount of chrome, for instance in accordance with specime, nr. 3.

FIG. 5 illustrates schematically and for sake of completeness and merely as example a plant or apparatus, resp. by means of which the method in accordance with the invention may be practised.

FIG. 5 illustrates a schematic representation of an exemplary vapor depositing apparatus for practising the method in accordance with the invention.

The vapor deposition apparatus has a vacuum chamber 19 including an evacuating connection 20 and a glowing cathode chamber 21 with the glowing cathode 22, which is in communication with the vacuum chamber 19 via an opening 25. The bottom 26 of the glowing cathode chamber 21 having the opening 25 is electrically insulated against the walls of the vacuum chamber 19. The glowing cathode 22 is supplied by a power supply device 27. A crucible 30 which can be cooled is located above the floor 29 of the vacuum chamber 19 and below the opening 25, in which crucible 30 aluminum and chrome are placed preferably in a Ti-liner 30a. Electrically conductive supports 35 which are rotatable around the longitudinal axis are present in the vacuum chamber 19, on which supports 35 the workpieces 3 to be coated are each held in a respective fastener 36. The supports 35 are arranged to rotate around their axis on a turntable 37 and are electrically interconnected by same. The turntable 37 is electrically insulated against the bottom 29 and the walls of the vacuum chamber. The fasteners 36 are e.g. electrically conductively connected to the supports 35. A gas feed line 39 opens into the glowing cathode chamber 21. The chamber 21 is connected to the vcuum chamber 19 via the opening 25.

The turntable 37 can be connected via an electrical line 47 and a switch 46 to an adjustable voltage generator 48 of which the other pole is grounded.

The voltage of a power supply apparatus 32 is applied to the glowing cathode 22 and the crucible 30.

The low voltage discharge onto crucible/liner/charge to be vaporized is shown at 52, the inlet for argon and oxygen at 53. The generally known structures of the apparatus for the etching of the workpieces are not illustrated.

While there are shown and described present preferred embodiments of the invention, it is to be distinctly understood that the invention is not limited thereto, but may be otherwise variously embodied and practised within the scope of the following claims.

We claim:

1. A hard coating consisting essentially of $(Al,Cr)_2O_3$ crystals having a share of chrome larger than 5 at %, wherein said $(Al,Cr)_2O_3$ is a single crystal.

2. The hard coating of claim 1, in which the chrome content amount to 10 to 50 at %.

3. A thermal insulation coating consisting essentially of $(Al,Cr)_2O_3$ crystals having a chrome content higher than 5 at %.

4. The coating of claim 3, in which the chrome content amounts to 10 to 50 at %.

5. The hard coating of claim 1, which coating is produced by evaporizing aluminum in a Ti-liner.

6. The hard coating of claim 5, in which the chrome content amounts to 10 to 50 at %.

7. A hard coating, consisting essentially of $(Al,Cr)_2O_3$ crystals having a chrome content of from 10 to 50 at % wherein said $(Al,Cr)_2O_3$ is a single crystal, the hard coating being deposited by maintaining a temperature less than or equal to 500° C.

8. The hard coatings of claim 1, wherein said hard coating is deposited by maintaining a temperature $\leq 500°$ C.

* * * * *